(12) United States Patent
Xiong et al.

(10) Patent No.: US 10,650,904 B2
(45) Date of Patent: May 12, 2020

(54) SHIFT REGISTER UNIT AND DRIVING METHOD THEREOF, GATE DRIVING APPARATUS AND DISPLAY APPARATUS

(71) Applicants: BOE Technology Group Co., Ltd., Beijing (CN); Hefei Xinsheng Optoelectronics Technology Co., Ltd., Hefei (CN)

(72) Inventors: Xiong Xiong, Beijing (CN); Rongcheng Liu, Beijing (CN); Jinliang Liu, Beijing (CN); Xiaozhe Zhang, Beijing (CN); Huanyu Li, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 77 days.

(21) Appl. No.: 15/765,214

(22) PCT Filed: Aug. 29, 2017

(86) PCT No.: PCT/CN2017/099388
§ 371 (c)(1),
(2) Date: Mar. 30, 2018

(87) PCT Pub. No.: WO2018/126716
PCT Pub. Date: Jul. 12, 2018

(65) Prior Publication Data
US 2019/0057755 A1    Feb. 21, 2019

(30) Foreign Application Priority Data
Jan. 4, 2017  (CN) .......................... 2017 1 0004514

(51) Int. Cl.
G09G 3/36   (2006.01)
G11C 19/28  (2006.01)
G11C 19/18  (2006.01)

(52) U.S. Cl.
CPC ......... G11C 19/287 (2013.01); G09G 3/3648 (2013.01); G09G 3/3677 (2013.01);
(Continued)

(58) Field of Classification Search
CPC .... G09G 3/296; G09G 3/3266; G09G 3/3283; G09G 3/3659; G09G 3/3674;
(Continued)

(56) References Cited

U.S. PATENT DOCUMENTS

2004/0046729 A1* 3/2004 Moon ................. G09G 3/3677
345/100
2010/0182227 A1  7/2010 Tsou
(Continued)

FOREIGN PATENT DOCUMENTS

CN  103093825 A  5/2013
CN  104505048 A  4/2015
(Continued)

OTHER PUBLICATIONS

Dec. 6, 2017—(WO) International Search Report and Written Opinion Appn PCT/CN2017/099388 with English Tran.

*Primary Examiner* — William Boddie
*Assistant Examiner* — Jeffrey Parker
(74) *Attorney, Agent, or Firm* — Banner & Witcoff, Ltd.

(57) ABSTRACT

There are provided a shift register unit and a driving method thereof. The shift register unit includes: an input circuit, whose first terminal receives an input signal of the shift register unit, and second terminal is connected to a pull-up node, the input circuit being configured to output the input signal to the pull-up node; an output circuit, whose first
(Continued)

terminal is connected to a clock signal terminal, second terminal is connected to the pull-up node, third terminal is connected to an output terminal of the shift register unit, the output circuit being configured to output a signal of the clock signal terminal to the output terminal under the control of the pull-up node; a pull-up node control circuit, and the pull-up node control circuit being configured to discharge the pull-up node through third power supply voltage terminal under the control of a first power supply voltage terminal.

17 Claims, 7 Drawing Sheets

(52) U.S. Cl.
CPC ............ *G11C 19/184* (2013.01); *G11C 19/28* (2013.01); *G09G 2300/0426* (2013.01); *G09G 2310/0286* (2013.01); *G09G 2310/08* (2013.01)

(58) Field of Classification Search
CPC ............... G09G 3/3677; G09G 3/3681; G09G 2310/02–0221; G09G 2310/0289; G09G 2310/0291
See application file for complete search history.

(56) References Cited

U.S. PATENT DOCUMENTS

| | | | |
|---|---|---|---|
| 2016/0055814 A1* | 2/2016 | Yang | G09G 3/3677 345/213 |
| 2016/0343335 A1 | 11/2016 | Cao | |
| 2017/0102801 A1 | 4/2017 | Ko et al. | |
| 2017/0193945 A1* | 7/2017 | Feng | G09G 3/3677 |

FOREIGN PATENT DOCUMENTS

| | | |
|---|---|---|
| CN | 105355235 A | 2/2016 |
| CN | 105976786 A | 9/2016 |
| CN | 106128352 A | 11/2016 |
| CN | 106504720 A | 3/2017 |
| CN | 206349133 U | 7/2017 |

* cited by examiner

SHIFT REGISTER UNIT AND DRIVING METHOD THEREOF, GATE DRIVING APPARATUS AND DISPLAY APPARATUS

The application is a U.S. National Phase Entry of International Application No. PCT/CN2017/099388 filed on Aug. 29, 2017, designating the United States of America and claiming priority to Chinese Patent Application No. 201710004514.8 filed on Jan. 4, 2017. The present application claims priority to and the benefit of the above-identified applications and the above-identified applications are incorporated by reference herein in their entirety.

TECHNICAL FIELD

The present disclosure relates to a shift register unit and a driving method thereof, a gate driving apparatus and a display apparatus.

BACKGROUND

A thin film transistor liquid crystal display (TFT-LCD) is widely applied in a variety of fields of production and life, and it adopts a progressive scanning matrix display arranged by M*N points. When displaying is performed, the TFT-LCD drives various pixels in the display panel to be displayed through a driving circuit. The driving circuit of the TFT-LCD mainly includes a gate driving circuit and a data driving circuit. Herein, the data driving circuit is used to sequentially latch the input data according to a clock signal timing and input the latched data to data lines of a display panel. The gate driving circuit is generally implemented by a shift register unit. The shift register unit converts a clock signal into a turn-on/turn-off voltage which is output to respective gate lines of the display panel respectively. One gate line on the display panel is always connected to one shift register unit (i.e., one stage of the shift register unit). Progressive scanning of pixels in the display panel is realized by making the respective shift register units output the turn-on voltage sequentially by turns.

On the other hand, as panel display develops, high resolution and narrow frame become the trend of development. In response to this trend, technique of Gate Driver on Array (GOA) emerges. The GOA technique integrates and manufactures the gate driving circuit of the TFT-LCD on an array substrate directly, thereby replacing a driving chip which is bonded with the outside edge of the panel and is made of silicon chip. Since this technique can make the driving circuit on the array substrate directly, there is no need to bond IC and arrange wirings around the panel, which reduces the manufacturing procedure of the panel, decreases the cost of production, and at the same time increases the integration of the TFT-LCD panel, so that the panel realizes narrow frame and high resolution.

At present, as a client user requires higher for aesthetic appearance and market price of products decreases gradually, and requirement for high-quality picture of a TFT-LCD panel becomes higher and higher, respective TFT-LCD panel is now using GOA technique to take place of conventional COG/COF technique, which on one hand reduces the production cost, and on the other hand makes the products more aesthetic.

SUMMARY

There is provided in the present disclosure a shift register unit and a driving method thereof, a gate driving apparatus and a display apparatus. Sufficient discharging of the shift register unit is implemented through a pull-up node control circuit, so that the potential of a pull-up node within the shift register unit is capable of being released fully, thereby avoiding that the shift register unit cannot operate normally due to abnormal shutdown, so as to ensure the quality of products, and prolong the service life of the TFT-LCD of the shift register unit.

According to one aspect of the present disclosure, there is disclosed a shift register unit, including: an input circuit, whose first terminal receives an input signal of the shift register unit, and second terminal is connected to a pull-up node, and the input circuit being configured to output the input signal to the pull-up node; an output circuit, whose first terminal is connected to a clock signal terminal, second terminal is connected to the pull-up node, third terminal is connected to an output terminal of the shift register unit, the output circuit being configured to output a signal of the clock signal terminal to the output terminal under the control of the pull-up node; a pull-up node control circuit, whose first terminal is connected to a first power supply voltage terminal, second terminal is connected to a third power supply voltage terminal, and third terminal is connected to the pull-up node, configured to: discharge the pull-up node through the third power supply voltage terminal under the control of the first power supply voltage terminal.

In one embodiment, when the first power supply voltage terminal jumps from a first level to a second level, the pull-up node control circuit discharges the pull-up node through the third power supply voltage terminal under the control of the second level; when the first power supply voltage terminal further jumps from the second level to a zero voltage, the pull-up node control circuit continuously discharges the pull-up node through the third power supply voltage terminal until the pull-up node is at the zero voltage.

In one embodiment, the pull-up node control circuit includes: a first transistor, whose gate and first electrode are connected to the first power supply voltage terminal; a first capacitor, whose first terminal is connected to a second electrode of the first transistor, and second terminal is connected to the third power supply voltage terminal; and a second transistor, whose gate is connected to the first terminal of the first capacitor, first electrode is connected to the pull-up node, and second electrode is connected to the third power supply voltage terminal.

In one embodiment, the first level of the first power supply voltage terminal is a low level, and the second level of the first power supply voltage terminal is a high level. The third power supply voltage terminal is also at the first level when the first power supply voltage terminal is at the first level, and the third power supply voltage terminal is still at the first level or at the zero voltage when the first power supply voltage terminal is at the second level.

According to another aspect of the present disclosure, there is disclosed a driving method for a shift register unit. The shift register unit includes an input circuit, an output circuit and a pull-up node control circuit. The method includes: when the first power supply voltage terminal jumps from the first level to the second level, the pull-up node control circuit discharges the pull-up node through the third power supply voltage terminal under the control of the second level.

In one embodiment, the method further includes: when the first power supply voltage terminal further jumps from the second level to the zero voltage, the pull-up node control circuit continuously discharges the pull-up node through the third power supply voltage terminal until the pull-up node is at the zero voltage.

In one embodiment, before the first power supply voltage terminal jumps from the first level to the second level, it further includes: a first operation phase, receiving an input signal of the shift register unit and outputting the input signal to the pull-up node, wherein the output circuit outputs a signal of the clock signal terminal to the output terminal under the control of the pull-up node; a second operation phase, the output circuit maintains the level of the pull-up node and continuously outputs the signal of the clock signal terminal to the output terminal.

According to another aspect of the present disclosure, there is disclosed a gate driving apparatus, including a plurality of shift register units connected in series, each of which is the shift register unit described above, wherein except a last shift register unit, an output terminal of each of remaining shift register units is connected to an input terminal of a next adjacent shift register unit; an input terminal of a first shift register unit is input a frame start signal.

According to another aspect of the present disclosure, there is disclosed a display apparatus including the gate driving apparatus.

BRIEF DESCRIPTION OF THE DRAWINGS

Preferable embodiments of the present disclosure are described in detail by combining with the accompanying figures. The above and other purposes, characteristic and advantages of the present disclosure would become more clear, wherein same reference marks are designated to units having a same structure, wherein.

DETAILED DESCRIPTION

Technical solutions in embodiments of the present disclosure will be described clearly and completely below by combining with the figures in the embodiments of the present disclosure. Obviously, the embodiments described are just a part of embodiments of the present disclosure, but not all the embodiments. Based on the embodiments in the present disclosure, all the other embodiments obtained by those ordinary skilled in the art without paying any inventive labor belong to the scope sought for protection in the present disclosure.

Transistors adopted in all the embodiments of the present disclosure can be thin film transistors or field effect transistors or other devices having same characteristics. In the embodiment, connection manner of a drain and a source of each transistor can be exchanged with each other. Therefore, drains and sources of respective transistors in the embodiments of the present disclosure have no distinction actually. Herein, for the purpose of convenient description, one of a drain and a source of a transistor is termed as a first electrode of the transistor, and another thereof is termed as a second electrode of the transistor.

Figure 1:
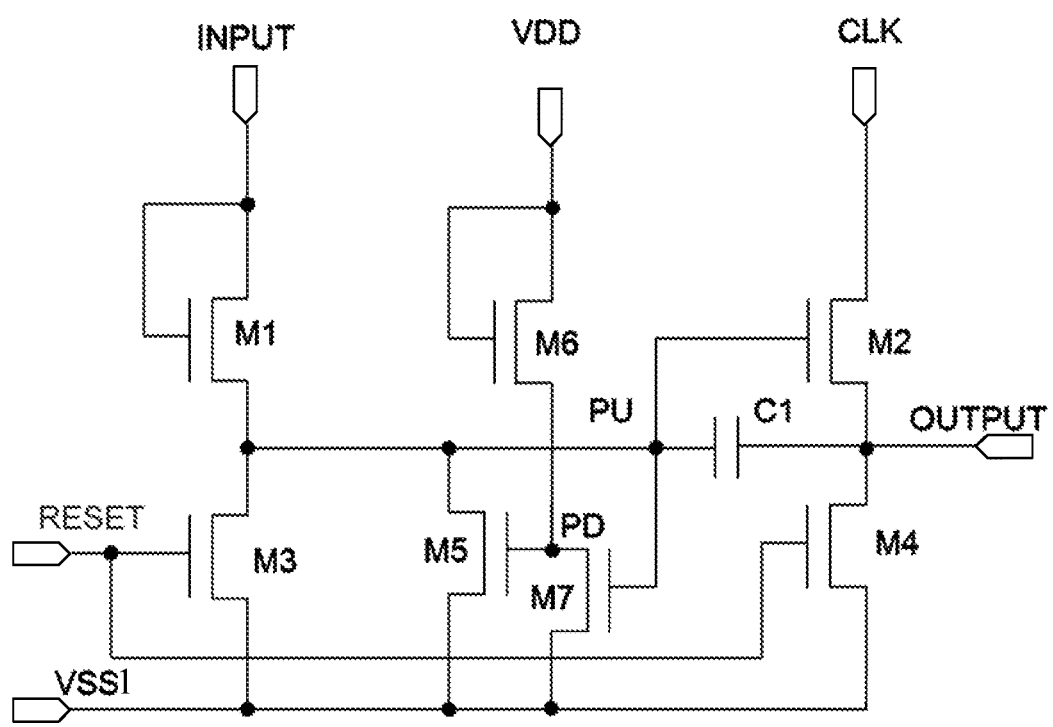
FIG. 1 shows a circuit diagram of a shift register unit.
Figure 2:
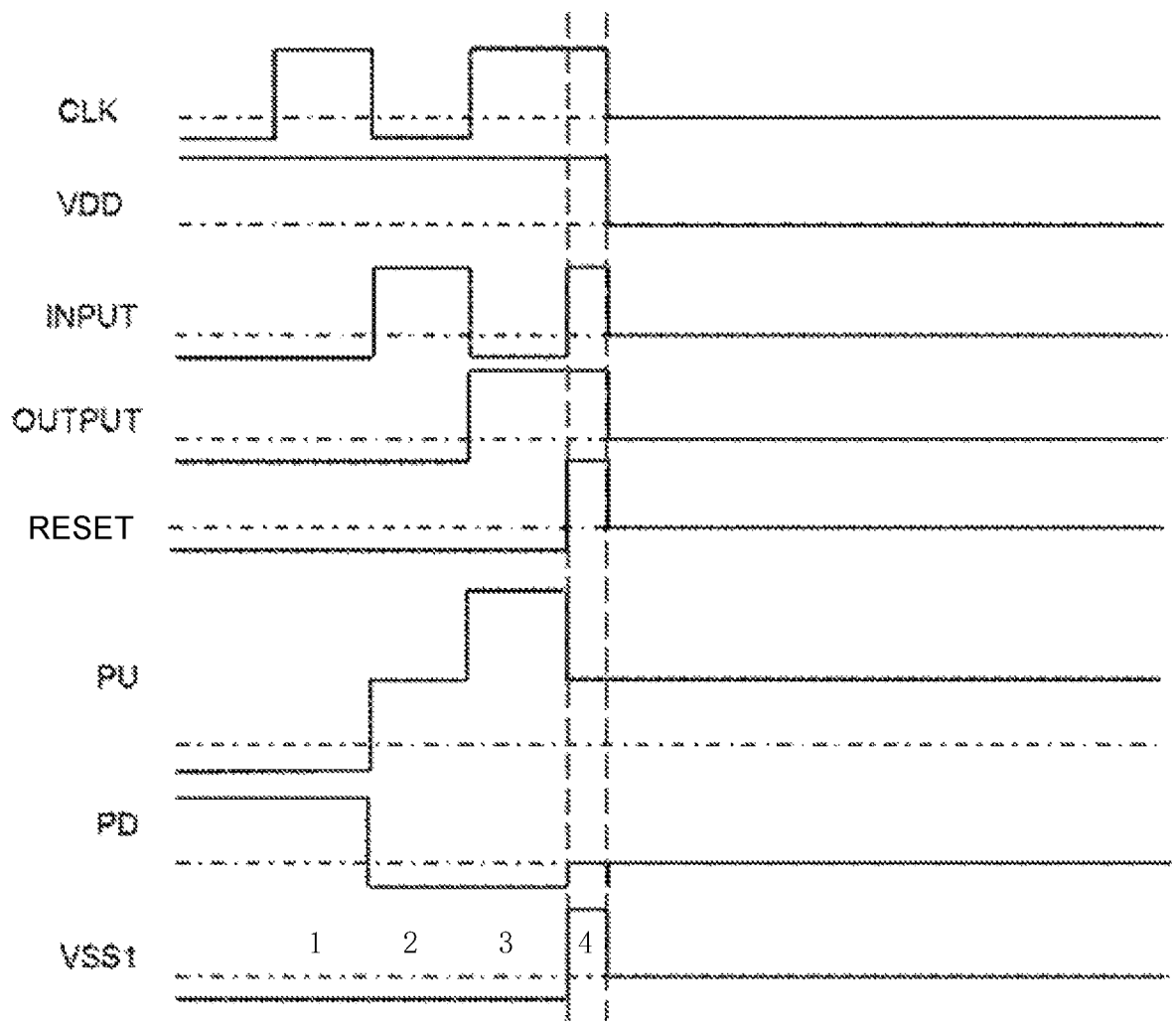
FIG. 2 shows an operation timing diagram of the shift register unit of FIG. 1.

FIG. 1 shows a circuit diagram of a shift register unit. FIG. 2 shows an operation timing diagram of the shift register unit in FIG. 1.

In FIG. 1, a duty ratio of a clock signal input to a clock signal terminal CLK is 50%, a first power supply voltage terminal VSS1 is a low power supply voltage terminal, a second power supply voltage terminal VDD is a high power supply voltage terminal and input a noise reduction signal to the shift register unit.

Operations of the shift register unit shown in FIG. 1 are described below by referring to FIGS. 1 and 2.

In a first phase 1, an input signal of an input terminal INPUT of the shift register unit is at a low level, and an input transistor M1 is turned off. Although the clock signal of the clock signal terminal CLK is at a high level, an output transistor M2 is turned off and an output terminal OUTPUT outputs the low level because a pull-up signal of a pull-up node PU is at a low level.

In a second phase 2, the input signal of the input terminal INPUT of the shift register unit is at a high level, and the clock signal of the clock signal terminal CLK is at a low level. At this time, the input transistor M1 is turned on to deliver the high level of the input terminal INPUT to the pull-up node PU. At this time, the pull-up node PU rises to the high level, so that the output transistor M2 is turned on. Since the clock signal of the clock signal terminal CLK is at a low level, the output terminal OUTPUT still outputs a low level.

In a third phase 3, the input signal of the input terminal INPUT of the shift register unit is at a low level, and the clock signal of the clock signal terminal CLK is at a high level. At this time, the input terminal M1 is turned off, and a potential of the pull-up node PU would be maintained at a high level constantly due to existence of a second capacitor C1, so as to continuously make the output transistor M2 turned on. Since the clock signal of the clock signal terminal CLK is at a high level, the output terminal OUTPUT outputs the high level, and further due to the bootstrap effect of the second capacitor C1, the potential of the pull-up node PU rises continuously. At the same time, since the potential of the pull-up node PU is at a high level, a transistor M7 is turned on, so that the pull-down node PD is pulled down to a low level of a first power supply voltage terminal VSS1.

If abnormal shutdown occurs at this time, as shown in a fourth phase in FIG. 2, a signal of the first power supply voltage terminal VSS1 is pulled up to the high level and at the same time a second power supply voltage terminal VDD is maintained at a high level, and then signals of the first power supply voltage terminal VSS1 and the second power supply voltage terminal VDD are quickly decreased to the low level.

It should be known that pull-up of the voltage of the first power supply voltage terminal VSS1 is specifically designed to solve the problem of the shutdown afterimages. In the case of normal operation, upon shutdown, the voltage of the first power supply voltage terminal VSS1 is pulled up as high as being capable of realizing that respective gate lines output the high level simultaneously, so that respective pixels are discharged to eliminate the afterimages. However, due to the abnormal shutdown, the pull-up of the voltage of the first power supply voltage terminal VSS1 also causes that that the potential of the pull-down node PD cannot be pulled up to the high level, so that the transistor M5 cannot be turned on, and thus the potential of the pull-down node PD cannot be released. Long-term and a plurality of times of abnormal shutdowns would cause that related TFT characteristics of the shift register unit (i.e., GOA circuit) change, such that the output of the shift register unit becomes abnormal.

In order to solve the above problem, there is provided in the present disclosure a shift register unit. The shift register unit realizes sufficient discharging of the shift register unit through the pull-up node control circuit, so that the potential of the pull-up node within the shift register unit is capable of being released fully, which avoids that the shift register unit cannot operate normally due to abnormal shutdown, so as to further ensure the quality of products and prolong the service life of the TFT-LCD of the shift register unit.

In particular, according to the embodiment of the present disclosure, a third power supply voltage terminal VSS2 is added. Furthermore, upon shutdown, the third power supply voltage terminal VSS2 would not jump from the low level to the high level like the first power supply voltage terminal VSS1, but would change to 0V.

According to the embodiment of the present disclosure, upon shutdown, the pull-up node control circuit 16 pulls down the pull-up node PU to 0V of the second power supply voltage terminal VSS2 under the control of the first power supply voltage terminal VSS1 and the second power supply voltage terminal VS S2, so as to realize reliable discharging of the pull-up node PU.

Figure 3:
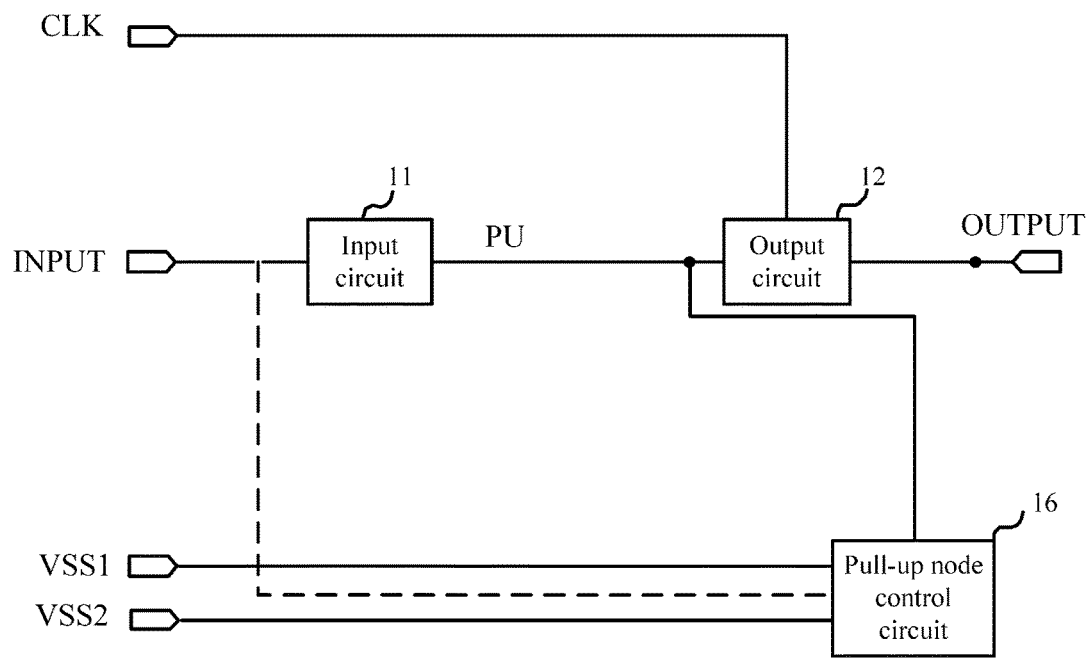
FIG. 3 shows a block diagram of a shift register unit according to an embodiment of the present disclosure.

FIG. 3 shows a block diagram of a shift register unit according to an embodiment of the present disclosure. As shown in FIG. 3, in one embodiment, a shift register unit 100 includes an input circuit 11, an output circuit 12 and a pull-up node control circuit 16.

A first terminal of the input circuit 11 receives the input signal INPUT of the shift register unit, a second terminal thereof is connected to the pull-up node PU, and the input circuit is configured to output the input signal INPUT to the pull-up node PU.

A first terminal of the output circuit 12 is connected to a clock signal terminal CLK, a second terminal thereof is connected to the pull-up node PU, and a third terminal thereof is connected to an output terminal OUTPUT of the shift register unit, and the output circuit 12 is configured to output the signal of the clock signal terminal CLK to the output terminal OUTPUT under the control of the pull-u node PU.

A first terminal of the pull-up node control circuit 16 is connected to the first power supply voltage terminal VSS1, a second terminal thereof is connected to the third power supply voltage terminal VSS2, and a third terminal thereof is connected to the pull-up node PU, and pull-up node control circuit 16 is configured to discharge the pull-up node PU through the third power supply voltage terminal VSS2 under the control of the first power supply voltage VSS1.

According to the embodiment of the present disclosure, when the first power supply voltage terminal jumps from the first level to the second level, the pull-up node control circuit discharges the pull-up node through the third power supply voltage terminal under the control of the second level.

Further, according to the embodiment of the present disclosure, when the first power supply voltage terminal further jumps from the second level to a zero voltage, the pull-up node control circuit continuously discharges the pull-up node through the third power supply voltage terminal until the pull-up node is at the zero voltage.

Optionally, the pull-up node control circuit further includes a fourth terminal connected to the input terminal INPUT of the shift register unit, and the pull-up node control circuit 16 is further configured to guarantee that the pull-up node PU is not pulled down wrongly when the input signal of the input terminal is at a valid level.

Figure 4:
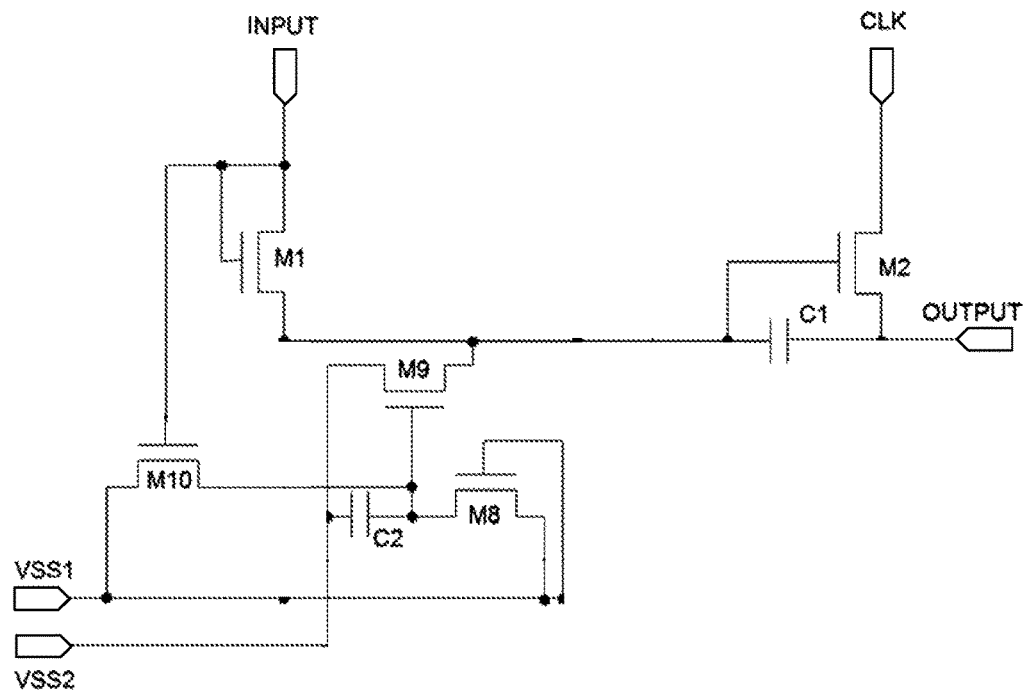
FIG. 4 shows an exemplary circuit structure diagram of a shift register unit according to an embodiment of the present disclosure.

FIG. 4 shows an exemplary circuit diagram of a shift register unit according to an embodiment of the present disclosure.

As shown in FIG. 4, in one embodiment, for example, the input circuit 11 includes an input transistor M1, whose gate and first electrode are connected to the input terminal INPUT, and second electrode is connected to the pull-up node PU. When the input signal of the input terminal INPUT is at a high level, the input transistor M1 is turned on to deliver the input signal of the input terminal INPUT to the pull-up node PU.

In one embodiment, for example, the output circuit 12 includes an output transistor M2 and a second capacitor C1. A gate of the output transistor M2 is connected to the pull-up node PU, a first electrode thereof is connected to the clock signal terminal CLK, and a second electrode thereof is connected to the output terminal OUTPUT. A first terminal of the second capacitor C1 is connected to the pull-up node PU, and a second terminal thereof is connected to the output terminal OUTPUT. when the pull-up signal of the pull-up node PU is at a high level, the output transistor M2 is turned on to output the clock signal of the clock signal terminal CLK to the output terminal OUTPUT.

In one embodiment, for example, the pull-up node control circuit 16 includes a first transistor M8, a first capacitor C2 and a second transistor M9. A gate and a first electrode of the first transistor M8 are connected to the first power supply voltage terminal VSS1, and a second electrode thereof is connected to a first terminal of the first capacitor C2, A second terminal of the first capacitor C2 is connected to the third power supply voltage terminal VSS2. A gate of the second transistor M9 is connected to the first terminal of the first capacitor C2, a first electrode thereof is connected to the pull-up node PU, and a second electrode thereof is connected to the third power supply voltage terminal VSS2.

In one embodiment, the pull-up node control circuit 16 further includes a third transistor M10, whose gate is connected to the input terminal INPUT of the shift register unit, first electrode is connected to the first terminal of the first capacitor C2, and second electrode is connected to the first power supply voltage terminal VSS1, so that the gate of the second transistor M9 is discharged through the first power supply voltage terminal VSS1 under the control of the input signal of the input terminal INPUT.

Figure 5:
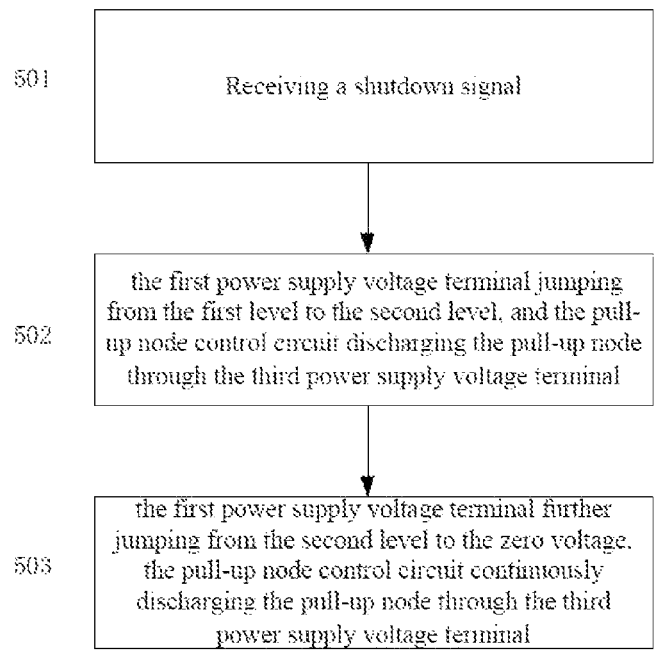
FIG. 5 shows an operation method for a shift register unit according to an embodiment of the present disclosure.

FIG. 5 shows a driving method for a shift register unit according to an embodiment of the present disclosure. The driving method of the shift register unit according to the embodiment of the present disclosure is suitable to the operation when the display apparatus is shut down.

In step 501, a shutdown signal is received.

In step 502, when the first power supply voltage terminal jumps from the first level to the second level, the pull-up node control circuit discharges the pull-up node through the third power supply voltage terminal under the control of the second level.

Optionally, in step 503, when the first power supply voltage terminal further jumps from the second level to the zero voltage, the pull-up node control circuit continuously discharges the pull-up node through the third power supply voltage terminal until the pull-up node is at a zero voltage.

Figure 6:
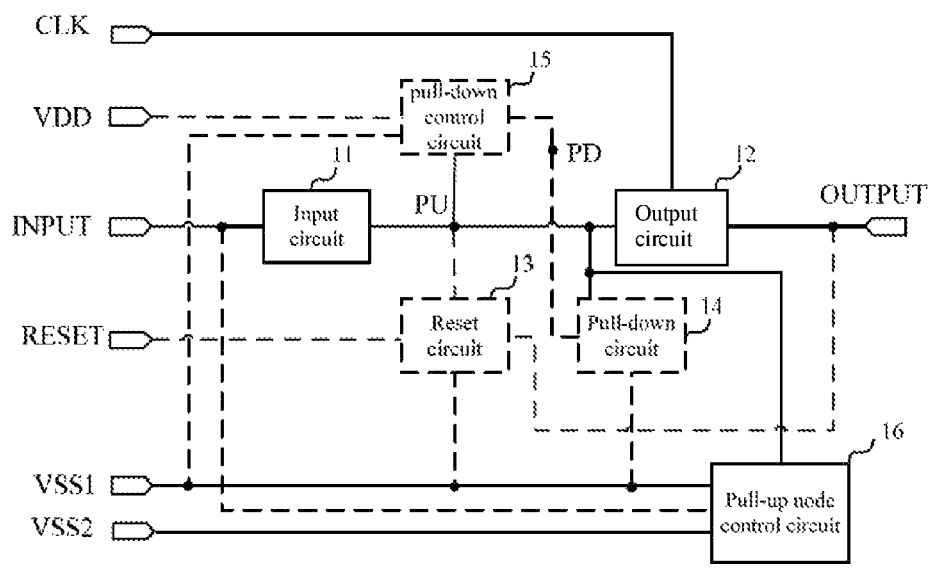
FIG. 6 shows a block diagram of a shift register unit according to another embodiment of the present disclosure.

FIG. 6 shows another schematic block diagram of a shift register unit according to an embodiment of the present disclosure. As shown in FIG. 6, in one embodiment, the shift register unit 100 includes an input circuit 11, an output circuit 12, a pull-down circuit 14, a pull-down control circuit 15 and a pull-up node control circuit 16.

A first terminal of the input circuit 11 is connected to the input terminal INPUT of the shift register unit and is used to receive an input signal from the input terminal INPUT, and a second terminal of the input circuit 11 is connected to the pull-up node PU. The input circuit 11 is configured to deliver the received input signal to the pull-up node PU when the input signal of the input terminal INPUT is at a valid input level.

A first terminal of the output circuit 12 is connected to the clock signal terminal CLK, a second terminal thereof is connected to the pull-up node PU, and a third terminal thereof is connected to the output terminal OUTPUT of the shift register unit. The output circuit 12 is configured to output the clock signal of the clock signal terminal CLK to the output terminal OUTUT when the pull-up signal of the pull-up node PU is at a valid pull-up level.

A first terminal of the pull-down control circuit 15 is connected to the second power supply voltage terminal VDD, a second terminal thereof is connected to the pull-down node PD, a third terminal thereof is connected to the first power supply voltage terminal VSS1, and a fourth terminal thereof is connected to the pull-up node PU. The pull-down control circuit 15 is configured to control the level of the pull-down node according to the level of the pull-up node PU, so as to control whether the pull-down circuit 14 performs any operation. For example, when levels of the first power supply voltage terminal and the second power supply voltage terminal are opposite, the pull-down control circuit 15 makes the level of the pull-down node opposite to the level of the pull-up node. In particular, a pull-down signal being at an invalid pull-down level is produced at the pull-down node PD when the pull-up signal of the pull-up node PU is at a valid pull-up level; a pull-down signal being at a valid pull-down level is produced at the pull-down node PD when the pull-up signal of the pull-up node PU is at an invalid pull-up level.

A first terminal of the pull-down circuit 14 is connected to the pull-down node PD, a second terminal thereof is connected to the pull-up node PU, and a third terminal thereof is connected to the first power supply voltage terminal VSS1. The pull-down circuit 14 is configured to pull down the pull-up node through the first power supply voltage terminal under the control of the pull-down node PD. For example, the level of the pull-up node PU is pulled down to the power supply voltage of the first power supply voltage terminal VSS1 when the pull-down signal of the pull-down node PD is at a valid pull-down level.

A first terminal of the pull-up node control circuit 16 is connected to the first power supply voltage terminal VSS1, a second terminal thereof is connected to the third power supply voltage terminal VSS2, and a third terminal thereof is connected to the pull-up node PU. The pull-up node control circuit 16 is configured to discharge the pull-up node through the third power supply voltage terminal VSS2 under the control of the first power supply voltage terminal VSS1. For example, when the first power supply voltage terminal VSS1 jumps from the first level to the second level, the pull-up node control circuit 16 discharges the pull-up node through the third power supply voltage terminal VSS2 under the control of the second level. In one embodiment, in the case of abnormal shutdown, the pull-up node control circuit 16 is configured to discharge the pull-up node PU when the first power supply voltage terminal VSS1 jumps to the high level suddenly. In another embodiment, when the first power supply voltage terminal further jumps from the second level to the zero voltage, the pull-up node control circuit continuously discharges the pull-up node through the third power supply voltage terminal until the pull-up node is at the zero voltage.

Optionally, in another embodiment, as shown in FIG. 6, the pull-up node control circuit 16 of the shift register unit 100 further includes a fourth terminal connected to the input terminal INPUT of the shift register unit. The pull-up node control circuit 16 is configured to control the level of the pull-up node PU according to the first power supply voltage terminal VSS1, the third power supply voltage terminal VSS2 and the input terminal INPUT. The pull-up node control circuit 16 is configured to discharge the pull-up node through the third power supply voltage terminal VSS2 under the control of the first power supply voltage terminal VSS1. The pull-up node control circuit 16 is further configured to ensure that the pull-up node PU is not pulled down wrongly when the input terminal INPUT is at a valid level, under the control of the input signal of the input terminal.

In the embodiment, the first power supply voltage terminal VSS1 and the third power supply voltage terminal VSS2 are low power supply voltage terminals, and the second power supply voltage terminal VDD is a high power supply voltage terminal.

Optionally, in another embodiment, the shift register unit 100 further includes reset circuit 13.

A first terminal of the reset circuit 13 is connected to a reset signal terminal RESET, a second terminal thereof is connected to the pull-up node PU, a third terminal thereof is connected to the first power supply voltage terminal VSS1, and a fourth terminal thereof is connected to the output terminal OUTPUT of the shift register unit. The reset circuit 13 is configured to reset the pull-up signal of the pull-up node PU to the power supply voltage of the first power supply voltage terminal VSS1 and reset the output signal of the output terminal OUTPUT to the power supply voltage of the first power supply voltage terminal VSS1 when the reset signal of the reset signal terminal RESET is at a valid control level.

There is further provided in the present disclosure a driving method for the shift register unit. The method will be described below by combining with FIGS. 6-8. In one embodiment, for example, as shown in FIG. 6, the shift register unit 100 includes an input circuit 11, an output circuit 12, a pull-down circuit 14, a pull-down control circuit 15 and a pull-up node control circuit 16. The method includes:

delivering, by the input circuit 11, a received input signal to the pull-up node PU;

outputting, by the output circuit 12, the clock signal of the clock signal terminal CLK to the output terminal OUTPUT of the shift register unit;

receiving a shutdown signal, and the first power supply voltage terminal VSS1 jumps from the low level to the high level; discharging, by the pull-up node control circuit 16, the pull-up node PU when the first power supply voltage terminal VSS1 jumps from the low level to the high level; and the first power supply voltage terminal VSS1 jumping from the high level to the zero voltage; discharging, by the pull-up node control circuit 16 continuously, the pull-up node PU until the pull-up node PU reaches the zero voltage, when the first power supply voltage terminal VSS1 jumps from the high level to the zero voltage.

In one embodiment, for example, as shown in FIG. 6, the shift register unit 100 further includes a reset circuit 13. The driving method of the shift register unit further includes: resetting, by the reset circuit 13, the pull-up signal of the pull-up node to the power supply voltage of the first power supply voltage terminal VSS1 and the output signal of the output terminal OUTPUT of the shift register unit to the power supply voltage of the first power supply voltage terminal VSS1.

Figure 7:
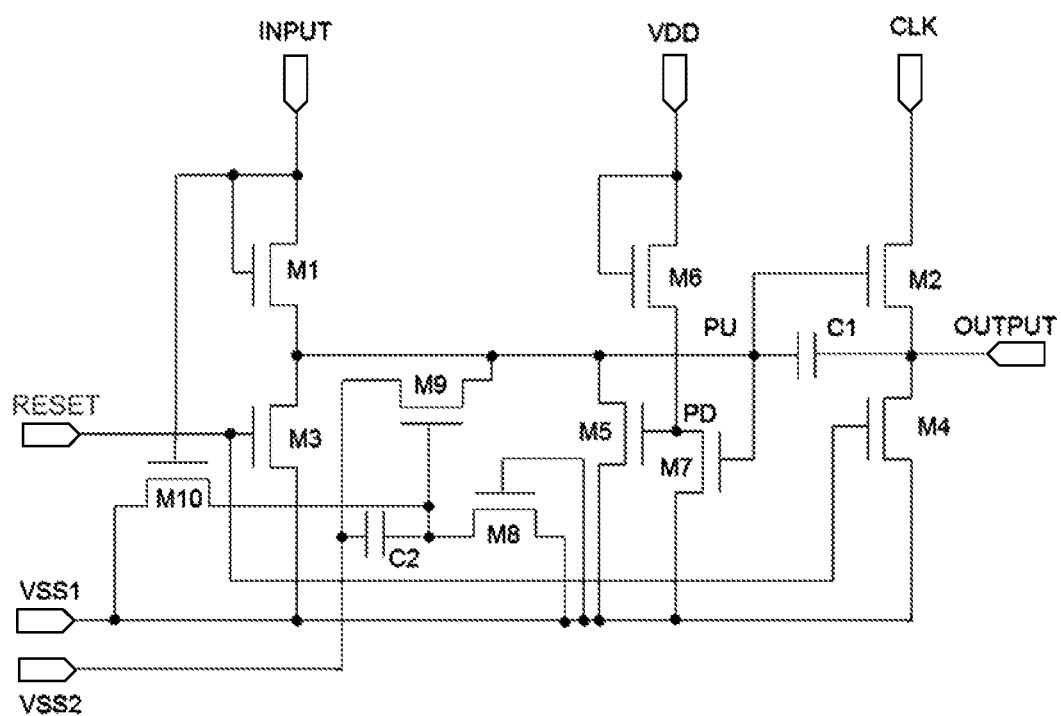
FIG. 7 shows an exemplary circuit structure diagram of a shift register unit according to another embodiment of the present disclosure.

FIG. 7 shows an exemplary circuit structure diagram of a shift register unit according to an embodiment of the present disclosure. Description is given below by taking transistors in FIG. 7 being N type transistors as an example. As well known by those skilled in the art, the N type transistor is turned on when the gate is input the high level.

As shown in FIG. 7, in one embodiment, for example, the input circuit 11 includes an input transistor M1, whose gate and first electrode are connected to the input terminal INPUT, and second electrode is connected to the pull-up node PU. When the input signal of the input terminal INPUT is at a high level, the input transistor M1 is turned on to deliver the input signal of the input terminal INPUT to the pull-up node PU.

In one embodiment, for example, the output circuit 12 includes an output transistor M2 and a second capacitor C1. A gate of the output transistor M2 is connected to the pull-up node PU, a first electrode thereof is connected to the clock signal terminal CLK, and a second electrode thereof is connected to the output terminal OUTPUT. A first terminal of the second capacitor C1 is connected to the pull-up node PU, and a second terminal thereof is connected to the output terminal OUTPUT. When the pull-up signal of the pull-up node PU is at a high level, the output transistor M2 is turned on to output the clock signal of the clock signal terminal CLK to the output terminal OUTPUT.

In one embodiment, for example, the pull-down control circuit 15 includes a first pull-down control transistor M6 and a second pull-down control transistor M7. A gate and a first electrode of the first pull-down control transistor M6 are connected to the second power supply voltage terminal VDD, and a second electrode thereof is connected to the pull-down node PD. A gate of the second pull-down control transistor M7 is connected to the pull-up node PU, a first electrode thereof is connected to the pull-down node PD, and a second electrode thereof is connected to the first power supply voltage terminal VSS1. For example, when the pull-up signal of the pull-up node PU is at a low level, the high level signal output by the second power supply voltage terminal VDD makes the first pull-down control transistor M6 turned on, and a pull-down signal being at a high level is produced at the pull-down node PD, so that the pull-down control transistor M5 is turned on; when the pull-up signal PU of the pull-up node PU is at a high level, the second pull-down control transistor M7 is turned on, and a channel parameter (for example, a channel width-to-length ratio) of the first pull-down control transistor M6 and the second pull-down control transistor M7 are selected reasonably, so that the pull-down signal being at a low level is produced at the pull-down node PD, and thus the pull-down transistor M5 is not turned on.

In one embodiment, for example, the pull-down circuit 14 includes a pull-down transistor M5. A gate of the pull-down transistor M5 is connected to the pull-down node PD, a first electrode thereof is connected to the pull-up node PU, and a second electrode thereof is connected to the first power supply voltage terminal VSS1. When the pull-down signal of the pull-down node PD is at a high level, the pull-down transistor M5 is turned on to pull down the pull-up signal of the pull-up node PU to the power supply voltage of the first power supply voltage terminal VSS1.

In one embodiment, for example, the pull-up node control circuit 16 includes a first transistor M8, a first capacitor C2 and a second transistor M9. A gate and a first electrode of the first transistor M8 are connected to the first power supply voltage terminal VSS1, and a second electrode thereof is connected to the first terminal of the first capacitor C2. A second terminal of the first capacitor C2 is connected to the third power supply voltage terminal VSS2. A gate of the second transistor M9 is connected to a first terminal of the first capacitor C2, a first electrode thereof is connected to the pull-up node PU, and a second electrode thereof is connected to the third power supply voltage terminal VSS2.

Optionally, in one embodiment, for example, the pull-up node control circuit 16 further includes a third transistor M10, whose gate is connected to the input terminal INPUT of the shift register unit, first electrode is connected to the first terminal of the first capacitor C2, and second electrode is connected to the first power supply voltage terminal VSS1.

Optionally, in another embodiment, the shift register unit 100 further includes a reset circuit 13. For example, the reset circuit 13 includes a node reset transistor M3 and an output reset transistor M4. A gate of the node reset transistor M3 is connected to a reset signal terminal RESET, a first electrode thereof is connected to the pull-up node PU, and a second electrode thereof is connected to the first power supply voltage terminal VSS1. A gate of the output reset transistor M4 is connected to the reset signal terminal RESET, a first electrode thereof is connected to the output terminal OUTPUT, and a second electrode thereof is connected to the first power supply voltage terminal VSS1. When the reset signal of the reset signal terminal RESET is at a high level, the node reset transistor M3 is turned on to reset the pull-up signal of the pull-up node PU to the power supply voltage of the first power supply voltage terminal VSS1, and the output reset transistor M4 is turned on to reset the output signal of the output terminal OUTPUT to the power supply voltage of the first power supply voltage terminal VSS1.

In the embodiment, the first power supply voltage terminal VSS1 and the third power supply voltage terminal VSS2 are low power supply voltage terminals, and the second power supply voltage terminal VDD is a high power supply voltage terminal.

In the shift register unit of the embodiment of the present disclosure, the potential of the pull-up node PU within the shift register unit is released fully upon abnormal shutdown through the pull-up node control circuit 16, which avoids that the shift register unit cannot operate normally due to abnormal shutdown, so as to further ensure the quality of products and prolong the service life of the TFT-LCD of the shift register unit.

Figure 8:
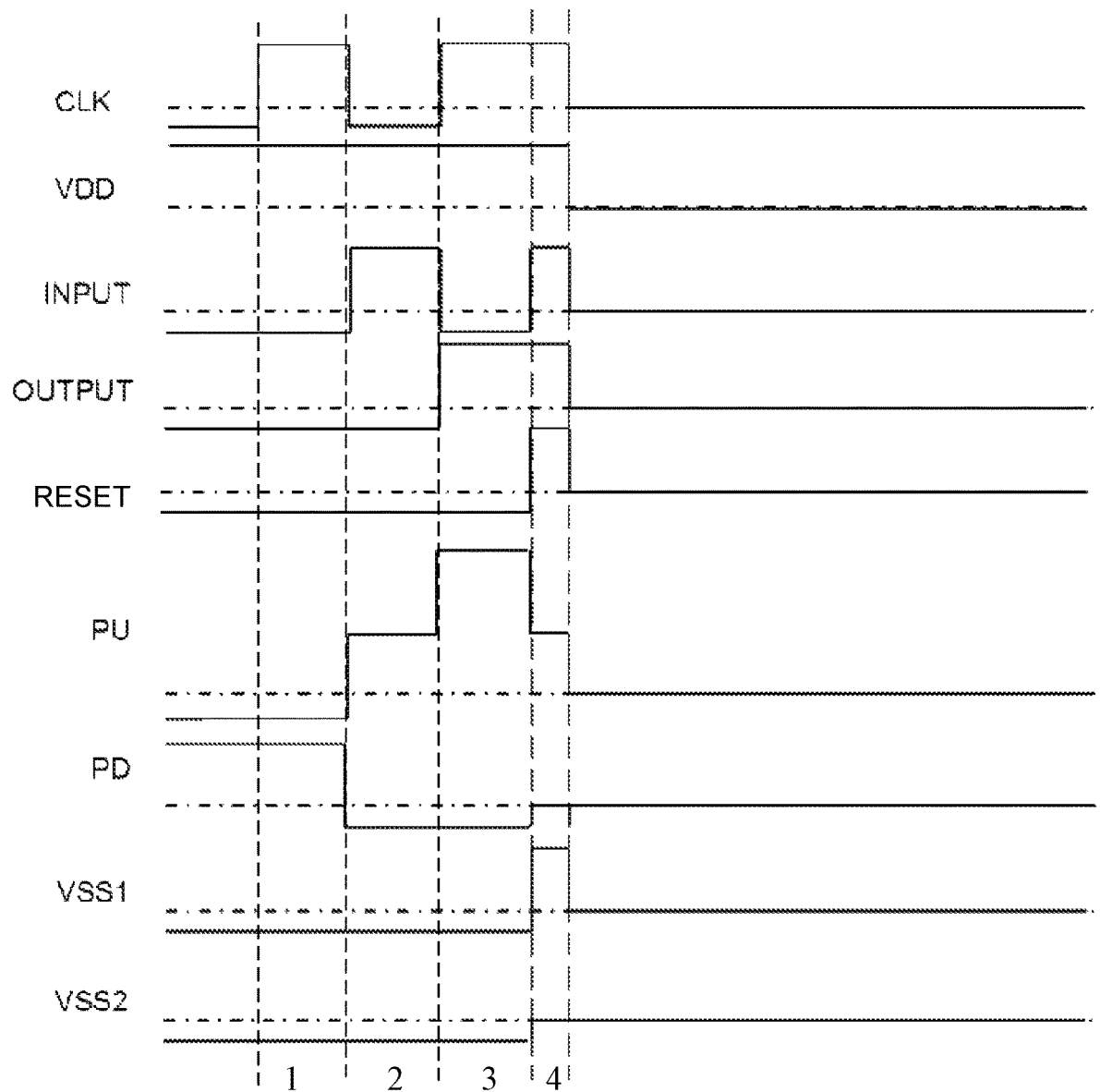
FIG. 8 shows an operation timing diagram of the exemplary circuit of the shift register unit in FIG. 7.

FIG. 8 shows an operation timing diagram of the exemplary circuit of the shift register unit in FIG. 7. The driving method for the shift register unit in FIG. 7 will be described below by combining with FIGS. 7 and 8.

In a first phase 1 (initialization phase), the input signal of the input terminal INPUT is at a low level. The input transistor M1 is turned off. Although the clock signal of the clock signal terminal CLK is at a high level, the output transistor M2 is turned off and the output terminal OUTPUT outputs a low level because the pull-up signal of the pull-up node PU is at a low level.

In a second phase 2 (input phase), the input signal of the input terminal INPUT is at a high level, and the clock signal of the clock signal terminal CLK is at a low level. The input transistor M1 is turned on to deliver the high level of the input terminal INPUT to the pull-up node PU. At this time, the pull-up node PU is at a first high voltage, so that the output transistor M2 is turned on. Since the clock signal of the clock signal terminal CLK is at a low level, the output terminal OUTPUT outputs a low level. Furthermore, since the pull-up node PU is at a first high voltage, so that the second pull-down control transistor M7 is turned on, so as to produce, at the pull-down node PD, a pull-down signal being at a low level.

In a third phase 3 (output phase), the input signal of the input terminal INPUT is at a low level, and the input transistor M1 is turned off. Due to the voltage maintenance effect of the second capacitor C1, the pull-up node PU continuously makes the output transistor M2 turned on, and since the clock signal of the clock signal terminal CLK is at a high level, the output terminal OUTPUT outputs the high level. Further, due to the voltage coupling effect of the second capacitor C1, the pull-up node PU is raised from the first high voltage to a second high voltage at this time. In addition, in this phase, since the pull-up node PU is at a high level, the second pull-down control transistor M7 maintains turned on, and the pull-down node PD is still at a low level.

If abnormal shutdown occurs in the above phase 3 (output phase), as described above, the signal of the first power supply voltage terminal VSS1 is simultaneously pulled up to the high level and the second power supply voltage terminal VDD is maintained at a high level at the same time. Then, signals of the first power supply voltage terminal VSS1 and the second power supply voltage terminal VDD are quickly reduced to the low level (see VSS1 and VDD shown in the phase 4 in FIG. 8).

The third power supply voltage terminal VSS2 is introduced in the embodiment of the present disclosure. The signal of the third power supply voltage terminal VSS2 is basically consistent with the signal of the first power supply voltage terminal VSS1, but it would not be pulled up to the high level upon shutdown (this part can be realized by PCBA) while would be pulled to 0V.

Operation of the pull-up node control circuit 16 according to an embodiment of the present disclosure in the case of abnormal shutdown will be described below in detail by referring to the circuit diagram of FIG. 7 and a fourth phase 4 of FIG. 8.

In the fourth phase 4, the first power supply voltage terminal VSS1 jumps from the low level to the high level, and the third power supply voltage terminal VSS2 is 0V. At this time, the first transistor M8 is turned on to charge the first capacitor C2, so that the second transistor M9 is turned on. Next, after the voltage signal of the first power supply voltage terminal VSS1 is reduced to 0V. Due to the voltage maintenance function of the first capacitor C2, the second transistor M9 is turned on continuously, so that the potential of the pull-up node PU is pulled down to 0V, thereby realizing discharging of the pull-up node PU.

Further, the pull-up node control circuit can further include a third transistor M10. For each frame, when scanning of each row starts, the third transistor M10 is turned on, so that the first capacitor C2 is discharged, and thus the normal charging function of the pull-up node PU is not affected.

In this embodiment, the first power supply voltage terminal VSS1 and the third power supply voltage terminal VSS2 are low power supply voltage terminals, and the second power supply voltage terminal VDD is a high power supply voltage terminal.

In the shift register unit of the embodiment of the present disclosure, full releasing of the potential of the pull-up node PU within the shift register upon abnormal shutdown is realized through the pull-up control circuit 16, which avoids from the shift register unit being damaged due to abnormal shutdown, so as to ensure the quality of products, thereby prolong the service life of the TFT-LCD applying the shift register unit.

In the shift register unit and the driving method thereof according to the embodiment of the present disclosure, sufficient discharging of the shift register unit is realized through the pull-up node control circuit, so that the potential of the pull-up node PU within the shift register unit is capable of being released fully upon abnormal shutdown through the pull-up node control circuit, which avoids that the shift register unit cannot operate normally due to abnormal shutdown, so as to further ensure the quality of products and prolong the service life of the TFT-LCD of the shift register unit.

Figure 9:
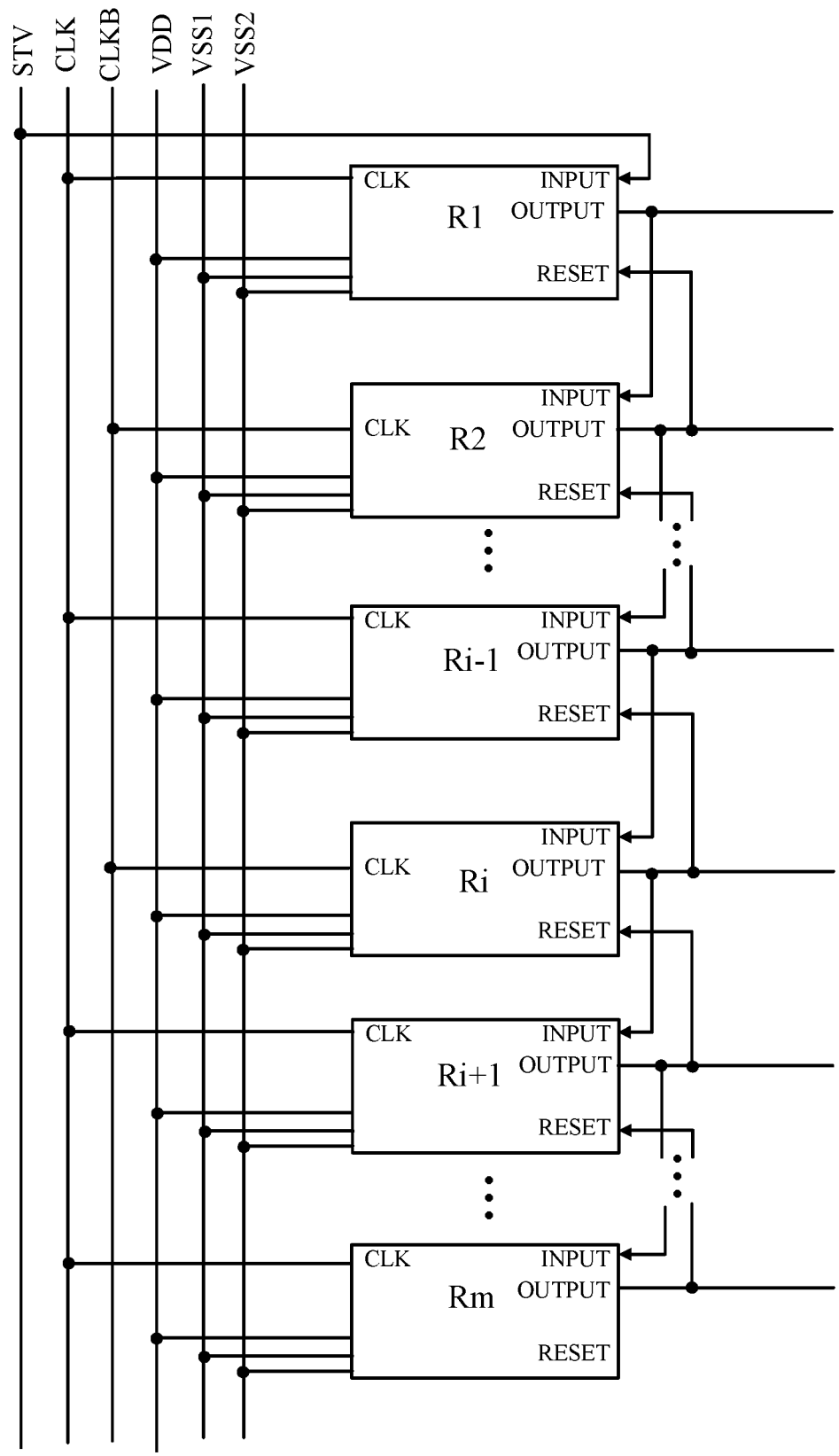
FIG. 9 shows a schematic diagram of a gate driving apparatus formed by a plurality of shift register units connected in series according to an embodiment of the present disclosure.

FIG. 9 shows a schematic diagram of a gate driving apparatus formed by a plurality of shift register units connected in series according to an embodiment of the present disclosure.

As shown in FIG. 9, in the gate driving apparatus, a plurality of the shift register units in FIG. 4 are connected in series, wherein except a last shift register unit Rm, an output terminal OUTPUT of each of remaining shift register units Ri (i≤i<m) is connected to an input terminal INPUT of a next adjacent shift register unit Ri+1. Or, a plurality of the shift register units in FIG. 7 are connected in series, wherein except a last shift register unit Rm, the output terminal OUTPUT of each of remaining shift register units Ri (i≤i<m) is connected to an input terminal INPUT of a previous adjacent shift register unit Ri−1. The input terminal INPUT of the first shift register unit R1 is input a frame start signal STV.

As shown in FIG. 6, in the gate driving apparatus, clock signals input to the clock signal terminals of two stages of adjacent shift register units are opposite. For example, the first shift register unit R1 is input a clock signal CLK, and then the second shift register unit R2 is input a clock signal CLKB, wherein the phases of the signals CLK and CLKB are opposite to each other.

It shall be noted that arrangement and connection of the shift register unit in the above gate driving apparatus is not limited to the above manner. For example, six shift register units can be taken as a group to be set. In this case, it needs one group of clock signals CLK1 to CLK6. That is, every six shift register units are taken as a group, a clock signal terminal of a first shift register unit is input a first clock signal CLK1, a clock signal terminal of a second shift register unit is input a clock signal CLK2, and a clock signal terminal of a third shift register unit is input a clock signal CLK3, and so on and so forth. An output signal of the fourth shift register unit is taken as a reset signal of the first shift register unit, and an output signal of the fifth shift register unit is taken as a reset signal of the second shift register unit, and so on and so forth.

Specific operation processes of respective shift register units of the gate driving apparatus according to an embodiment of the present disclosure when scanning is performed are similar to the operation process described by referring to FIGS. 7 and 8. No further details are given herein.

The gate driving apparatus according to an embodiment of the present disclosure can adopt the GOA technique to be used as the gate driving circuit of the display apparatus to provide the function of progressive scanning and deliver a scanning signal to the display area.

The gate driving apparatus according to an embodiment of the present disclosure can avoid that the shift register unit cannot operate normally due to abnormal shutdown, so as to further ensure the quality of products and prolong the service life of the TFT-LCD of the shift register unit.

There is further provided in the present disclosure a display apparatus of the gate driving apparatus described above.

The display apparatus herein can be any product or means having the function of displaying, such as an electronic paper, a mobile phone, a tablet, a television set, a display, a laptop, a digital photo frame, a navigator, etc.

The display apparatus according to an embodiment of the present disclosure can avoid that the shift register unit cannot operate normally due to abnormal shutdown, so as to ensure the quality of products, so that the service life of the TFT-LCD can be prolonged.

The above descriptions are specific embodiments of the present disclosure, but the protection scope of the present disclosure is not limited thereto. Any alternation or replacement that can be conceived easily by those skilled in the art who are familiar with the technical field within the technical scope disclosed in the present disclosure shall be covered within the protection scope of the present disclosure. Therefore, the protection scope of the present disclosure shall be subject to the protection scope of the claims.

What is claimed is:

1. A shift register unit, comprising:
    an input circuit, whose first terminal receives an input signal of the shift register unit, and second terminal is connected to a pull-up node, the input circuit being configured to output the input signal to the pull-up node;
    an output circuit, whose first terminal is connected to a clock signal terminal, second terminal is connected to the pull-up node, and third terminal is connected to an output terminal of the shift register unit, and the output circuit being configured to output a signal of the clock signal terminal to the output terminal under the control of the pull-up node; and
    a pull-up node control circuit, whose first terminal is connected to a first power supply voltage terminal, second terminal is connected to a third power supply voltage terminal, and third terminal is connected to the pull-up node, the pull-up node control circuit being configured to discharge the pull-up node through the third power supply voltage terminal under the control of the first power supply voltage terminal,
    wherein when the first power supply voltage terminal jumps from a first level to a second level, the pull-up node control circuit discharges the pull-up node through the third power supply voltage terminal under the control of the second level, and
    wherein when the first power supply voltage terminal further jumps from the second level to a zero voltage, the pull-up node control circuit continuously discharges the pull-up node through the third power supply voltage terminal until the pull-up node is at a zero voltage.

2. The shift register unit according to claim 1, wherein a fourth terminal of the pull-up node control circuit is connected to an input terminal of the shift register unit, and the pull-up node control circuit is further configured to ensure that the pull-up node is not pulled down when an input signal of the input terminal is at a valid level.

3. The shift register unit according to claim 1, wherein the pull-up node control circuit comprises:
    a first transistor, whose gate and first electrode are connected to the first power supply voltage terminal;
    a first capacitor, whose first terminal is connected to a second electrode of the first transistor, and second terminal is connected to the third power supply voltage terminal; and
    a second transistor, whose gate is connected to the first terminal of the first capacitor, first electrode is connected to the pull-up node, and second electrode is connected to the third power supply voltage terminal.

4. The shift register unit according to claim 2, wherein the pull-up node control circuit comprises:
    a first transistor, whose gate and first electrode are connected to the first power supply voltage terminal;
    a first capacitor, whose first terminal is connected to a second electrode of the first transistor, and second terminal is connected to the third power supply voltage terminal;
    a second transistor, whose gate is connected to the first terminal of the first capacitor, first electrode is connected to the pull-up node, and second electrode is connected to the third power supply voltage terminal; and
    a third transistor, whose gate is connected to the input terminal of the shift register unit, first electrode is connected to the first terminal of the first capacitor, and second electrode is connected to the first power supply voltage terminal.

5. The shift register unit according to claim 1, further comprising:
    a pull-down circuit, whose first terminal is connected to a pull-down node, second terminal is connected to the pull-up node, third terminal is connected to the first power supply voltage terminal, the pull-down circuit being configured to pull down the pull-up node through the first power supply voltage terminal under the control of the pull-down node; and
    a pull-down control circuit, whose first terminal is connected to a second power supply voltage terminal, second terminal is connected to the pull-down node, third terminal is connected to the first power supply voltage terminal, and fourth terminal is connected to the pull-up node, and the pull-down control circuit being configured to, when levels of the first power supply voltage terminal and the second power supply voltage terminal are opposite, make a level of the pull-down node opposite to a level of the pull-up node.

6. The shift register unit according to claim 1, further comprising:
    a reset circuit, whose first terminal is connected to a reset signal terminal, second terminal is connected to the pull-up node, third terminal is connected to the first power supply voltage terminal, and fourth terminal is connected to the output terminal of the shift register unit, the reset circuit being configured to pull down the pull-up node and the output terminal through the first power supply voltage terminal under the control of the reset signal terminal.

7. The shift register unit according to claim 1, wherein the input circuit comprises:
an input transistor, whose gate and first electrode are connected to an input terminal of the shift register unit, and second electrode is connected to the pull-up node.

8. The shift register unit according to claim 1, wherein the output circuit comprises:
an output transistor, whose gate is connected to the pull-up node, first electrode is connected to the clock signal terminal, and second electrode is connected to the output terminal; and
a second capacitor, whose first terminal is connected to the pull-up node, and second terminal is connected to the output terminal.

9. The shift register unit according to claim 5, wherein the pull-down circuit comprises:
a pull-down transistor, whose gate is connected to the pull-down node, first electrode is connected to the pull-down node, and second electrode is connected to the first power supply voltage terminal.

10. The shift register unit according to claim 5, wherein the pull-down control circuit comprises:
a first pull-down control transistor, whose gate and first electrode are connected to the second power supply voltage terminal, and second electrode is connected to the pull-down node; and
a second pull-down control transistor, whose gate is connected to the pull-up node, first electrode is connected to the pull-down node, and second electrode is connected to the first power supply voltage terminal.

11. The shift register unit according to claim 1, wherein the first level of the first power supply voltage terminal is a low level, the second level of the first power supply voltage terminal is a high level the third power supply voltage terminal is also at the first level when the first power supply voltage terminal is at the first level, and the third power supply voltage terminal is still at the first level or at a zero voltage when the first power supply voltage terminal is at the second level.

12. A driving method for the shift register unit according to claim 1, comprising:
the pull-up node control circuit discharging the pull-up node through the third power supply voltage terminal under the control of the second level when the first power supply voltage terminal jumps from a first level to the second level; and
when the first power supply voltage terminal further jumps from the second level to the zero voltage, the pull-up node control circuit continuously discharging the pull-up node through the third power supply voltage terminal until the pull-up node is at the zero voltage.

13. The driving method according to claim 12, wherein the pull-up node control circuit comprises:
a first transistor, whose gate and first electrode are connected to the first power supply voltage terminal;
a first capacitor, whose first terminal is connected to a second electrode of the first transistor, and second terminal is connected to the third power supply voltage terminal; and
a second transistor, whose gate is connected to the first terminal of the first capacitor, first electrode is connected to the pull-up node, and second electrode is connected to the third power supply voltage terminal,
wherein when the first power supply voltage terminal jumps from the first level to the second level, the first transistor is turned on to charge the first capacitor, and the second transistor is turned on to discharge the pull-up node through the third power supply voltage terminal; and
when the first power supply voltage terminal further jumps from the second level to a zero voltage, the first capacitor makes the second transistor maintain turned on and continuously discharges the pull-up node through the third power supply voltage terminal.

14. The driving method according to claim 12, wherein before the first power supply voltage terminal jumps from the first level to the second level, the method further comprises:
a first operation phase, receiving the input signal of the shift register unit and outputting the input signal to the pull-up node, wherein the output circuit outputs the signal of the clock signal terminal to the output terminal under the control of the pull-up node; and
a second operation phase, wherein the output circuit maintains a level of the pull-up node and continuously outputs the signal of the clock signal terminal to the output terminal.

15. The driving method according to claim 12, wherein the first level of the first power supply voltage terminal is a low level, the second level of the first power supply voltage terminal is a high level, the third power supply voltage terminal is also at the first level when the first power supply voltage terminal is at the first level, and the third power supply voltage terminal is still at the first level or at a zero voltage when the first power supply voltage terminal is at the second level.

16. A gate driving apparatus, comprising a plurality of shift register units connected in series, each of which is the shift register unit according to claim 1, wherein
except for a last shift register unit, an output terminal of each of remaining shift register units is connected to an input terminal of a next adjacent shift register unit; and
an input terminal of a first shift register unit is input a frame start signal.

17. A display apparatus comprising the gate driving apparatus according to claim 16.

* * * * *